(12) United States Patent
Opris

(10) Patent No.: US 9,007,865 B1
(45) Date of Patent: Apr. 14, 2015

(54) MEMORY CIRCUIT, PERSISTENT AFTER THE REMOVAL OF THE POWER SUPPLY

(71) Applicant: Ion E. Opris, San Jose, CA (US)

(72) Inventor: Ion E. Opris, San Jose, CA (US)

( * ) Notice: Subject to any disclaimer, the term of this patent is extended or adjusted under 35 U.S.C. 154(b) by 29 days.

(21) Appl. No.: 14/025,828

(22) Filed: Sep. 13, 2013

(51) Int. Cl.
*G11C 5/14* (2006.01)
*H03K 3/356* (2006.01)

(52) U.S. Cl.
CPC ............ *H03K 3/356008* (2013.01); *G11C 5/14* (2013.01)

(58) Field of Classification Search
USPC ........... 365/226, 63, 51, 52, 189.011, 189.17, 365/204
See application file for complete search history.

(56) References Cited

U.S. PATENT DOCUMENTS 8,903,024 B2 * 12/2014 Lee et al. ...................... 375/340

* cited by examiner

*Primary Examiner* — Fernando Hidalgo

(57) ABSTRACT

According to some embodiments, an electronic circuit comprises a digital output which is held to a logic one after the power supply was removed, for a time duration in a narrow range. The electronic circuit comprises a first array of elements comprising capacitors and discharging devices (diodes or transistors). A time constant detector detects which elements has the discharging time closest to the target. A second array of elements also comprises capacitors and discharging devices, with discharging durations proportional to the discharging durations of the first array. A decoder charges the appropriate element from the second array. After the power is removed, this charged element starts to discharge. During the discharge duration, a comparator outputs a logic one, and a logic zero after the discharge is completed.

15 Claims, 9 Drawing Sheets

MEMORY CIRCUIT, PERSISTENT AFTER THE REMOVAL OF THE POWER SUPPLY

BACKGROUND

This invention relates to an electronic circuit which sets the value of a bit to one during several seconds after the power supply was removed from the said circuit, and which sets to zero the value of the said bit afterwards.

Electronic systems such as passive sensors for radio-frequency identification (RFID) are powered, for a short period of time, during which they fulfill their basic function of transmitting certain information to the reading terminal. After the power was removed, they are required to remember that a reading action just took place, and, for a duration of a few seconds, to not respond to any subsequent reading attempt. After this duration has elapsed, the sensor must respond to a new reading inquiry. This feature is achieved by including in the sensor certain circuitry which sets a bit to one for the few required seconds, and to zero afterwards.

A conventional technique uses the discharge of a capacitor through a resistor. The required time constant must be well controlled and in the range of seconds. However, this technique either requires a prohibitively large on-chip resistor, or an external capacitor, both solutions being unattractive for very low-cost sensors. Another conventional technique is to use the discharge of an on-chip capacitor through a low-leaking device such as a reverse-biased p-n junction or a MOS transistor. A drawback of this technique is that the leaking current of the discharging device highly varies with the temperature, typically exhibiting an exponential behavior. Therefore, the discharging time constant will have an inadmissible high temperature spread. To avoid the large temperature variation of the leakage current, another conventional technique adds a second current, having a tighter temperature variation, to the leakage current. The drawback consists in a higher discharging current than the leakage current, leading to larger capacitors.

It is therefore useful and desirable to use a circuit which outputs a one-bit signal, the said output signal being set and held to one for a duration of a few seconds after the power was removed from the circuit and subsequently re-applied, and being set and held to zero afterwards, wherein the duration when the said signal is held to one has a low variation with the ambient temperature and the process spread (the "persistence duration"), and which does not require large capacitors.

SUMMARY

Aspects of the invention include a circuit comprising, one one-bit output, a first array of elements, each element of the first array comprising a capacitor in parallel with a reverse-biased p-n diode, wherein the discharge times of the first array elements are in a geometric progression, and the longest said discharge time of the first array is shorter than the duration during which the said circuit is powered from an external power source. A second array of elements comprises the same number of elements as the first array, each element of the second array comprising a capacitor in parallel with a reverse-biased p-n diode, wherein the discharge time of any element from the second array is equal to the discharge time of the corresponding element from the first array multiplied by a constant. During the time when the circuit is powered a calibration circuit selects the element from the first array which discharge time is the closest to a pre-determined value and charges the corresponding element from the second array, while leaving uncharged the other elements of the second array. Each element of the second array is connected to the input of a decision block (logic OR circuit), which output is connected to the said circuit one-bit output. After the power supply is removed, the charged element from the second array starts to discharge. When the discharging process brings the voltage at the decision block input below its threshold, the said decision block toggles its output. Therefore, the one-bit output will stay at one for a well-defined duration after the power was removed.

Aspects of the invention include a circuit comprising one one-bit output, a first array of elements, each element of the first array comprising a capacitor in parallel with a MOS transistor biased in the sub-threshold region, wherein the discharge times of the first array elements are in a geometric progression, and the longest said discharge time of the first array is shorter than the duration during which the said circuit is powered from an external power source. A second array of elements comprises the same number of elements as the first array, each element of the second array comprising a capacitor in parallel with a MOS transistor biased in the sub-threshold region, wherein the discharge time of any element from the second array is equal to the discharge time of the corresponding element from the first array multiplied by a constant. During the time when the circuit is powered a calibration circuit selects the element from the first array which discharge time is the closest to a pre-determined value and charges the corresponding element from the second array, while leaving uncharged the other elements of the second array. Each element of the second array is connected to the input of a decision block (logic circuit), which output is connected to the said circuit one-bit output. After the power supply is removed, the charged element from the second array starts to discharge. When the discharging process brings the voltage at the decision block input below its threshold, the said decision block toggles its output. Therefore, the one-bit output will stay at one for a well-defined duration after the power was removed and subsequently re-applied.

BRIEF DESCRIPTION OF THE DRAWINGS

The foregoing aspects and advantages of the present invention will become better understood upon reading the following detailed description and upon reference to the drawings where.

DETAILED DESCRIPTION OF PREFERRED EMBODIMENTS

The following description illustrates the present invention by way of example and not necessarily by way of limitation. Any reference to an element is understood to refer to at least one element. A set of elements is understood to include one or more elements. Any recited connection is understood to encompass a direct operative connection or an indirect operative connection through intermediary structure(s).

Figures 1A, 1B:
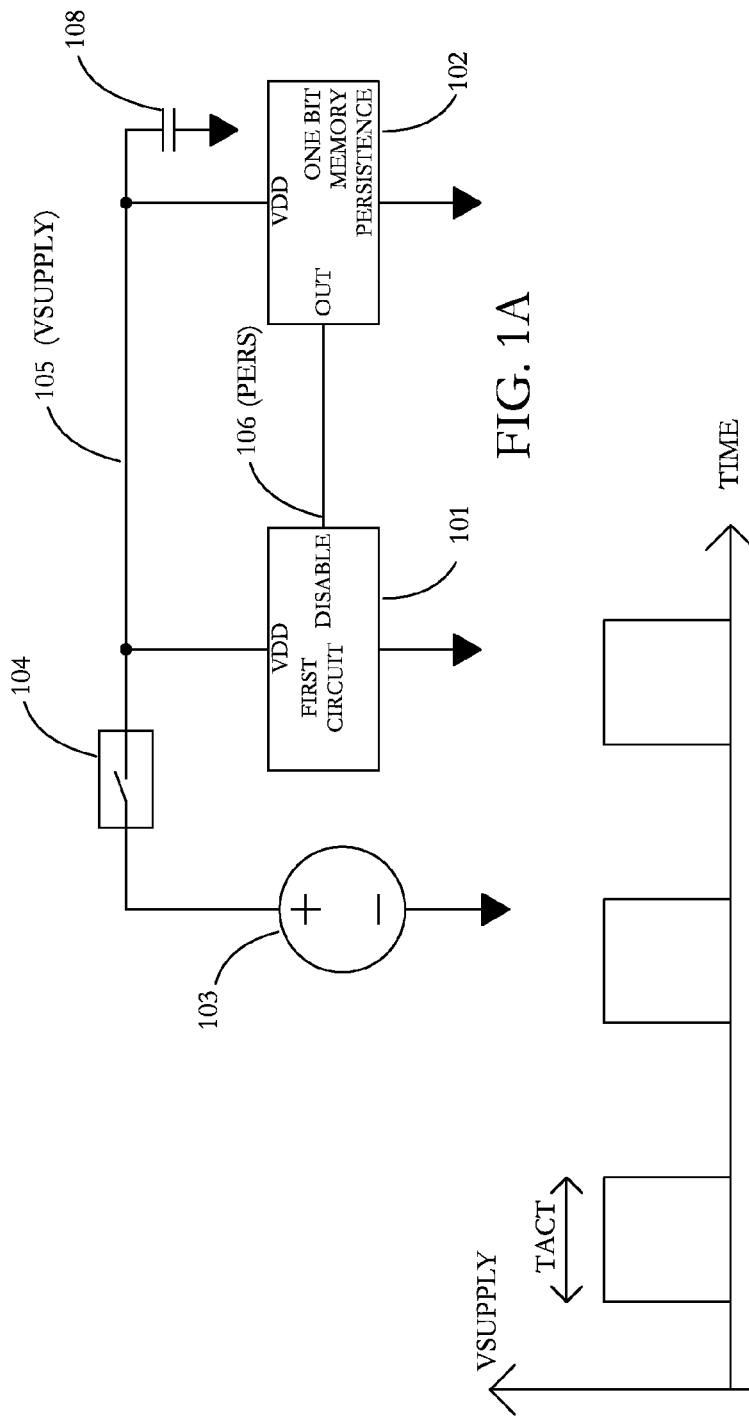
FIG. 1A shows the block diagram of an electronic device comprising a first circuit having a digital input for disabling, a one-bit memory persistence circuit which output is connected to the said disabling digital input, and a power supply which is removed after a certain duration from supplying the first and the persistence circuits, wherein the first circuit executes a pre-determined sequence of steps when it is supplied from the power supply, and the persistence circuit holds its output to a logic level high for a duration in a certain range after the power was removed and subsequently re-applied, and it further holds the said digital output to zero, until the next cycle in which the power supply is applied.
FIG. 1B shows the waveform of the power supply and the waveform of the persistence bit.

FIG. 1A shows the block diagram of an electronic device comprising a first circuit 101 having a digital input for disabling, a one-bit memory persistence circuit 102 which output is connected to the said disabling digital input, and a power supply 103, according to some embodiments of the present invention. In a given operating cycle, the power supply is at first applied, and then removed after a certain duration from supplying the first and the persistence circuits, using the switch 104. After the power supply is applied, if and only if the control signal 106 is set to a logic zero, the first circuit 101 executes a pre-determined sequence of steps, representative of the main functionality of the said electronic device. Also during the time when the power supply is applied, the persistence circuit 102 executes internally a self-calibration procedure intended to select an internal first capacitor with a discharging time in a certain range. As soon as the self-calibration procedure is completed, the one-bit digital output 106 is set to a logic one. Also after the power supply is removed, a second capacitor, internal to the persistence circuit, discharges. When the voltage across the second capacitor crosses a certain threshold, the output 106 is set to logic zero after the power was removed and subsequently re-applied, and further kept to zero until the power supply is applied in the next operating cycle.

FIG. 1B shows the waveforms of the voltage of the electrical node 105 and the voltage of the output of the persistence circuit 102, during an operating cycle. The voltage of 106 is turned to one during the time when the power supply is applied, and held to one for a duration TPERS irrespective how many times the supply is removed and subsequently re-applied. The purpose of the persistence circuit 102 is to ensure that TPERS is always in a defined range (TMIN<TPERS<TMAX).

Figure 2:
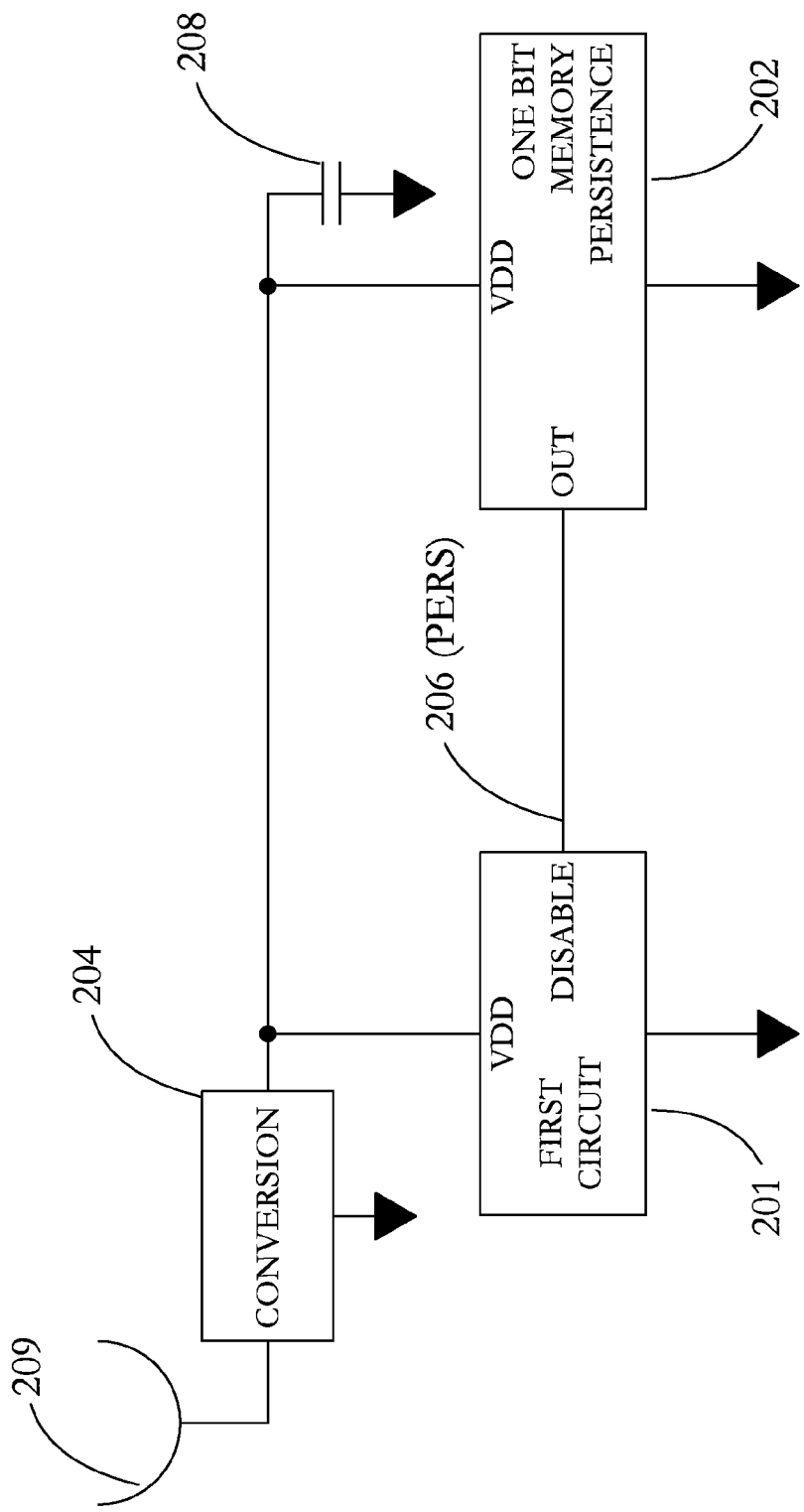
FIG. 2 shows the block diagram of an electronic passive RFID terminal (also known as an "RFID tag") comprising a first circuit having a digital input for disabling, a one-bit memory persistence circuit which output is connected to the said disabling digital input, and a conversion circuit which converts the electromagnetic energy received by an antenna into DC power supply, wherein the first circuit executes a pre-determined sequence of steps when it is supplied from the power supply, and the persistence circuit holds its output to a logic level high for a duration in a certain range after the power was removed and subsequently re-applied, and it further holds the said digital output to zero, until the next cycle in which the power supply is applied.

FIG. 2 shows the block diagram of an electronic passive RFID terminal comprising a first circuit 201 having a digital input for disabling, a one-bit memory persistence circuit 202 which output is connected to the said disabling digital input, and an energy conversion circuit 204, according to some embodiments of the present invention. Electromagnetic radiation is received by the antenna 209 and used by the energy conversion circuit 204 to generate a power supply. Therefore, in a given operating cycle, the power supply is at first applied, and then removed after a certain duration TACT from supplying the first and the persistence circuits. After the power supply is applied, if and only if the control signal 206 is detected to be set to a logic zero, the first circuit 201 executes a pre-determined sequence of steps, representative of the main functionality of the said RFID terminal. During the time TACT when the power supply is applied the storage capacitor 208 is charged to a voltage VDD. Also during the time when the power supply is applied, the persistence circuit 202 executes internally a self-calibration procedure intended to select an internal first capacitor with a discharging time in a certain range. As soon as the self-calibration procedure is completed, the one-bit digital output 206 is set to a logic one. After the power supply is removed, a second capacitor, internal to the persistence circuit, discharges. When the voltage across the second capacitor crosses a certain threshold, the output 206 is set to logic zero, and further kept to zero until the power supply is applied in the next operating cycle.

Figure 3:
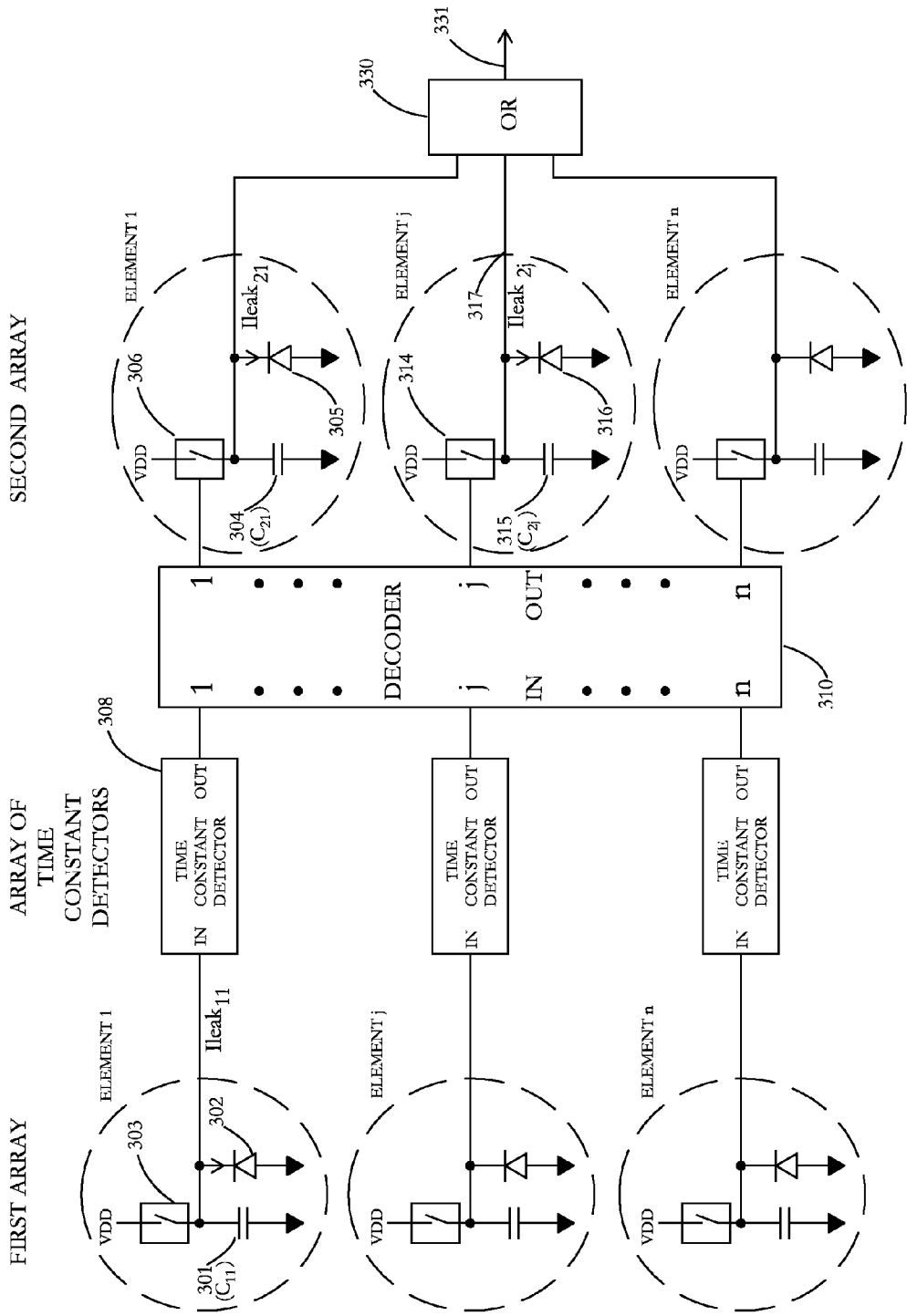
FIG. 3 shows the schematic of a one-bit memory persistence circuit, comprising a first and a second arrays of elements, each element of the two arrays comprising a capacitor in parallel with a reverse-biased p-n diode, wherein the discharge times of the elements in the second array compared to those from the first array are proportional. During the time when the power supply is applied a calibration circuit determines which element from the first array has the discharge time within a certain range, and the corresponding element from the second array is then charged. After the power supply is removed, the said corresponding element will discharge, and a bit will be held to one during the discharge time, and to zero afterwards.

FIG. 3 shows the schematic of a one-bit memory persistence circuit, according to some embodiments of the present invention. The persistence circuit comprises a first array of n elements, each element of the first array comprising a capacitor (301 for the first element) in parallel with a reverse-biased p-n diode (302 for the first element), and a switch 303 connecting the capacitor 301 and VDD. Each of the said elements from the first array is further connected to a time constant detector (308 for the first element). The discharge times of the elements in the first array are designed to be in a geometric progression, as follows:

$$tau_{11} = C_{11} * \frac{V_{DD}}{Ileak_{11}} = TAUMIN,$$

$$tau_{1i} = C_{1i} * \frac{V_{DD}}{Ileak_{1i}} = G^{i-1} * TAUMIN, \text{ wherein } G > 1.$$

The scale factor G is chosen such that, when multiplied by supra-unitary factors accounting for the worst-case mismatching ratios for capacitors and NMOS transistor currents, and for the accuracy of the time constant detectors, is less than the ratio TMAX/TMIN. A second array of elements comprises the same number of elements n as the first array, each element of the second array comprising a capacitor (304 for the first element) in parallel with a reverse-biased p-n diode (305 for the first element), and a switch 306 connecting the capacitor 304 and VDD. The discharge times of the elements from the second array are designed to be proportional to the corresponding discharge times of the elements from the first array: $tau_{2i} = K*tau_{1i} = K*G^{i-1}*TAUMIN$, wherein $K>1$.

Also referring to FIG. 3, when the power supplied is applied, the switches from all the elements from the first array are turned on for a short duration, charging the capacitors from the first array to a voltage substantially equal to VDD. As soon as the said switches from the first array are turned off, the time constant detectors connected to each of the elements from the first array are turned on. After the time constant detection sequence is completed, each said detector will output a digital signal with a logic value one if the corresponding first array element has a discharge time shorter than a reference value TAUREF (hence if $tau_{1i}$<TAUREF), and a logic zero otherwise. Therefore, after the time constant detection sequence is completed, the time constant detectors with the indexes 1 to j will output a value one, and the time constant detectors with the indexes j+1 to n will output a value zero. The logic decoder 310 has n outputs, and will output a logic one at its output with the index j, and a logic zero for all other outputs. Therefore functionally, the decoder outputs a value one only for the index corresponding to the element in the first array which discharging time is the longest, but still shorter than TAUREF. The switch from the second array 314 having the index j is turned on for a short duration, charging the capacitor 315. All the other switches from the second array are left turned off. After the supply power is removed, the switch 314 is turned off, and the capacitor 315 starts discharging through the diode 316. As long as the voltage across 315 is higher than the threshold of the input of the decision block (digital OR circuit) 330, and the voltage across the storage capacitor will be high enough such that the circuit 330 can operate, the output of the said OR circuit 330 will also set the node 331 to a logic one. The output 331 of 330 will be set to logic zero when the voltage across 315 will fall below the threshold of the input of 330. Given the proportionality relationships, the output 331 will therefore turn to one when the power supply is removed and will be held to one for a duration approximately equal to K*TAUREF if the power supply is subsequently re-applied.

Figure 4:
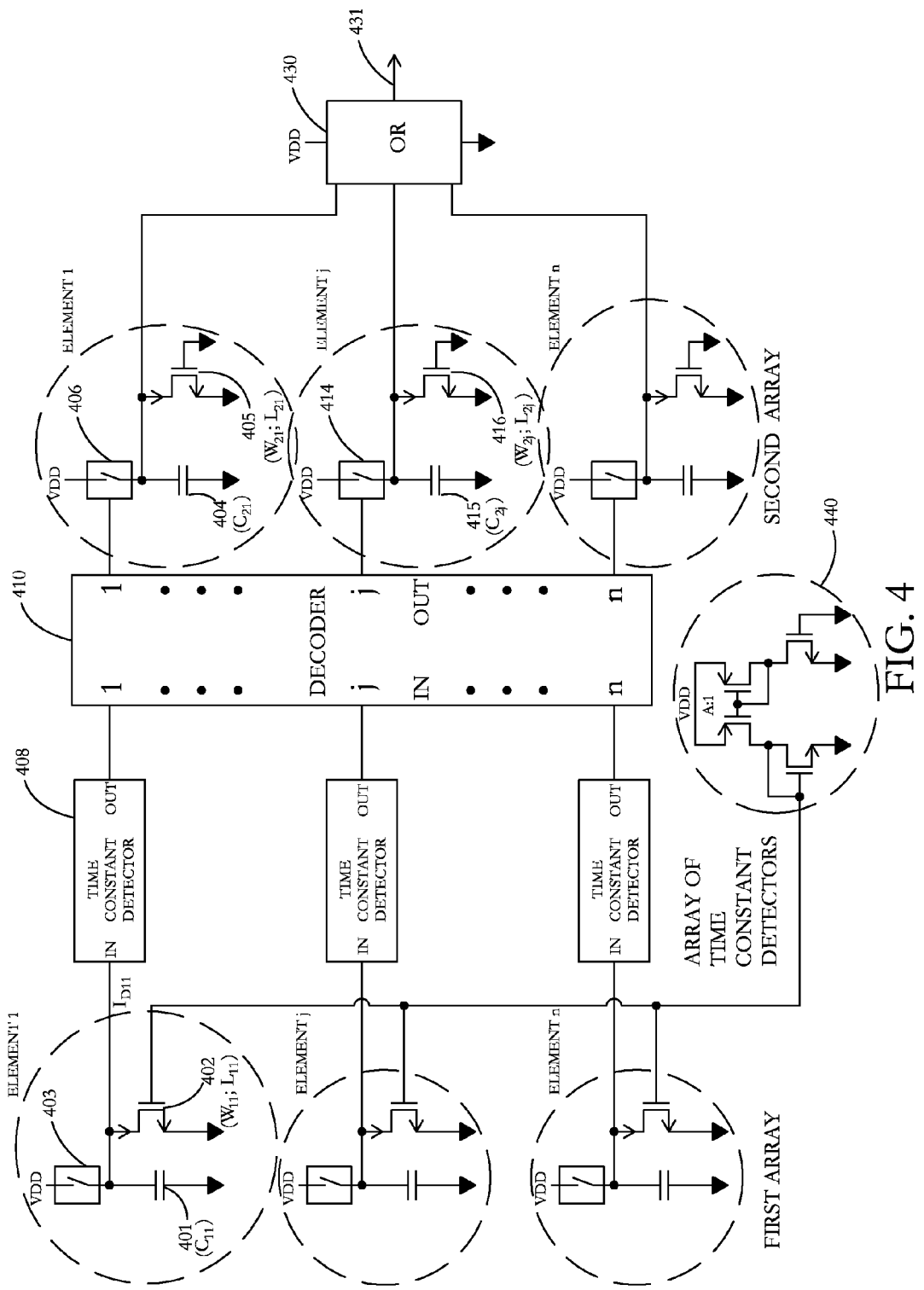
FIG. 4 shows the schematic of a one-bit memory persistence circuit, comprising a first and a second arrays of elements, each element of the two arrays comprising a capacitor in parallel with an NMOS transistor biased in the sub-threshold region, wherein the discharge times of the elements in the second array compared to those from the first array are proportional. During the time when the power supply is applied a calibration circuit determines which element from the first array has the discharge time within a certain range, and the corresponding element from the second array is then charged. After the power supply is removed, the said corresponding element will discharge, and a bit will be held to one during the discharge time, and to zero afterwards.

FIG. 4 shows the schematic of a one-bit memory persistence circuit, according to some embodiments of the present invention. The persistence circuit comprises a first array of n elements, each element of the first array comprising a capacitor (401 for the first element) in parallel with an NMOS transistor biased in the sub-threshold region (402 for the first element), and a switch 403 connecting the capacitor 401 and VDD. Each of the said elements from the first array is further connected to a time constant detector (408 for the first element). The drain current of an NMOS transistor can be approximated by the formula: $I_D=I_s*W/L$, where W and L are width and the length of the transistor, and $I_s$ is a current depending upon the biasing voltages of the transistor. The discharge times of the elements in the first array are designed to be in a geometric progression, as follows:

$$tau_{11} = C_{11} * \frac{V_{DD}}{I_{s1}} * \frac{L_{11}}{W_{11}} = TAUMIN,$$

$$tau_{1i} = C_{1i} * \frac{V_{DD}}{I_{s1}} * \frac{L_{1i}}{W_{1i}} = G^{i-1} * TAUMIN, \text{ wherein } G > 1.$$

The scale factor G is chosen such that, when multiplied by supra-unitary factors accounting for the worst-case mismatching ratios for capacitors and NMOS transistor currents, and for the accuracy of the time constant detectors, is less than the ratio TMAX/TMIN. A second array of elements comprises the same number of elements n as the first array, each element of the second array comprising a capacitor (404 for the first element) in parallel with an NMOS transistor biased in the sub-threshold region (405 for the first element), and a switch 406 connecting the capacitor 404 and VDD. The discharge times of the elements from the second array are designed to be proportional to the corresponding discharge times of the elements from the first array:

$$tau_{2i} = C_{2i} * \frac{V_{DD}}{I_{s2}} * \frac{L_{2i}}{W_{2i}} = K * tau_{1i} = K * G^{i-1} * TAUMIN,$$

wherein $K > 1$.

Since in many cases a large proportionality factor K is desired, and scaling up capacitors and transistor sizes (W/L) is limited for die area reasons, a ratio $$\frac{I_{s2}}{I_{s1}} < 1$$

can be used. An artisan will implement such a ratio of currents using techniques well-known in the art, such as the current mirrors 440.

Also referring to FIG. 4, when the power supplied is applied, the switches from all the elements from the first array are turned on for a short duration, charging the capacitors from the first array to a voltage substantially equal to VDD. As soon as the said switches from the first array are turned off, the time constant detectors connected to each of the elements from the first array are turned on. After the time constant detection sequence is completed, each said detector will output a digital signal with a logic value one if the corresponding first array element has a discharge time shorter than a reference value TAUREF (hence if $tau_{1i}$<TAUREF), and a logic zero otherwise. Therefore, after the time constant detection sequence is completed, the time constant detectors with the indexes 1 to j will output a value one, and the time constant detectors with the indexes j+1 to n will output a value zero. The logic decoder 410 has n outputs, and will output a logic one at its output with the index j, and a logic zero for all other outputs. Functionally, the decoder outputs a value one only for the index corresponding to the element in the first array which discharging time is the longest, but still shorter than TAUREF. The switch from the second array 414 having the index j is turned on for a short duration, charging the capacitor 415. All the other switches from the second array are left turned off. After the supply power is removed, the switch 414 is turned off, and the capacitor 415 starts discharging through the transistor 416. As long as the voltage across 415 is higher than the threshold of the input of the decision block (digital OR circuit) 430, and the voltage across the storage capacitor will be high enough such that the circuit 430 can operate, the output of the said OR circuit 430 will also set the node 431 to a logic one. The output 431 of 430 will be set to logic zero when the voltage across 415 will fall below the threshold of the input of 430. Given the proportionality relationships, the output 431 will therefore turn to one when the power supply is removed and will be held to one for a duration approximately equal to K*TAUREF if the power supply is subsequently re-applied.

Also referring to FIGS. 3 and 4, it is important to note that the invented one-bit persistent memory will fulfill its task even if the voltage across the storage capacitor 208 falls below the value at which the OR circuit 430 (or 330) can no longer operate, since the voltage across the capacitor 415 (or 315) is still higher than the threshold of the input of 430 (or 330) (hence, during the persistence duration). In such a case, it is true that the output 431 (or 331) will immediately be set to a logic zero. However, if the power is rapidly re-applied (for example, if a new reading of the RFID terminal is attempted) during the persistence duration, the output 431 (or 331) will immediately be set to a logic one.

Referring to FIGS. 3 and 4, it will also be clear that the range of the discharging times of the second array (and consequently of the first array, since they are related by a proportionality factor) must be wide enough in order to account for the wide spread of the drain current of a MOS transistor biased in the sub-threshold region (or the leakage current of a reverse-biased diode) over temperature, process variations, and supply voltage. Similarly, the longest discharging time among all elements from the first array, under any temperature, process corner, and supply voltage, must be shorter than the time during which the power supply is applied (or, for an passive RFID passive terminal, shorter than the duration of an electromagnetic pulse emitted by the reading device).

Figure 5:
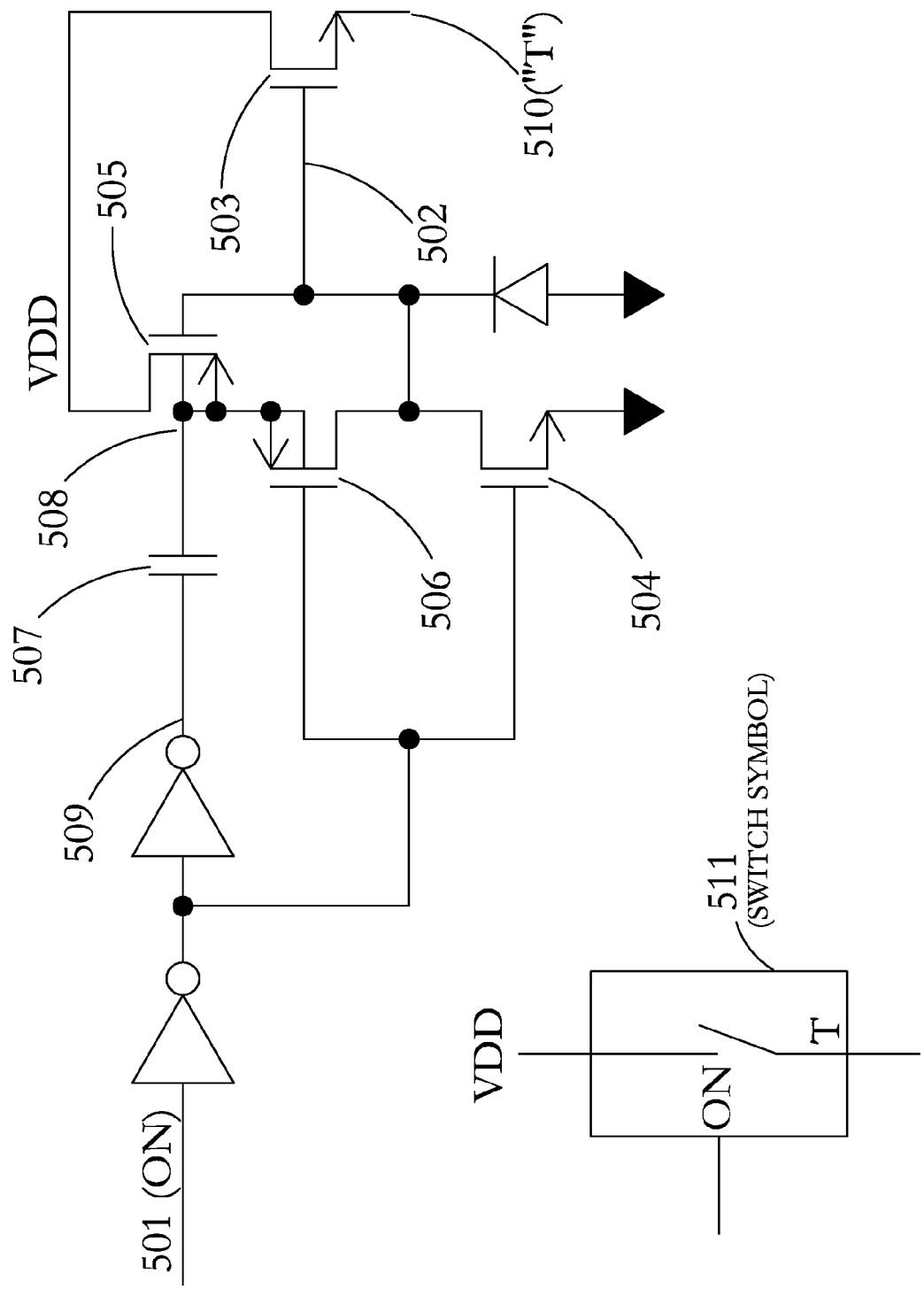
FIG. 5 shows the schematic of a switch connected to VDD which maintains a low leakage even when the supply is removed.

Referring to FIGS. 3 and 4, the switches from the second array must maintain their "off" state even when the power supply is removed. A simple PMOS transistor having the source and the bulk connected to the power supply cannot therefore be used, since the transistor will conduct current when VDD approaches zero. FIG. 5 shows the schematic of a switch using a voltage booster, and which ensures a very low leakage current after the power supply is removed, according to some embodiments of the present invention. The switching device is the NMOS transistor 503. The gate control voltage 502 is either 0V (in the "off" state), or approximately 2*VDD (in the "on" state). In the "off" state, 504 and 505 are turned on, hence the voltage across the capacitor 507 is substantially equal to VDD, wherein the voltage of the node 508 is substantially equal to VDD. In the "on" state, 504 and 505 are turned off, 506 is turned on, the impedance of the node 508 becomes very high, and the voltage of 508 is equal to the voltage of 509 (~VDD) plus the voltage across 507 (~VDD).

Figure 6:
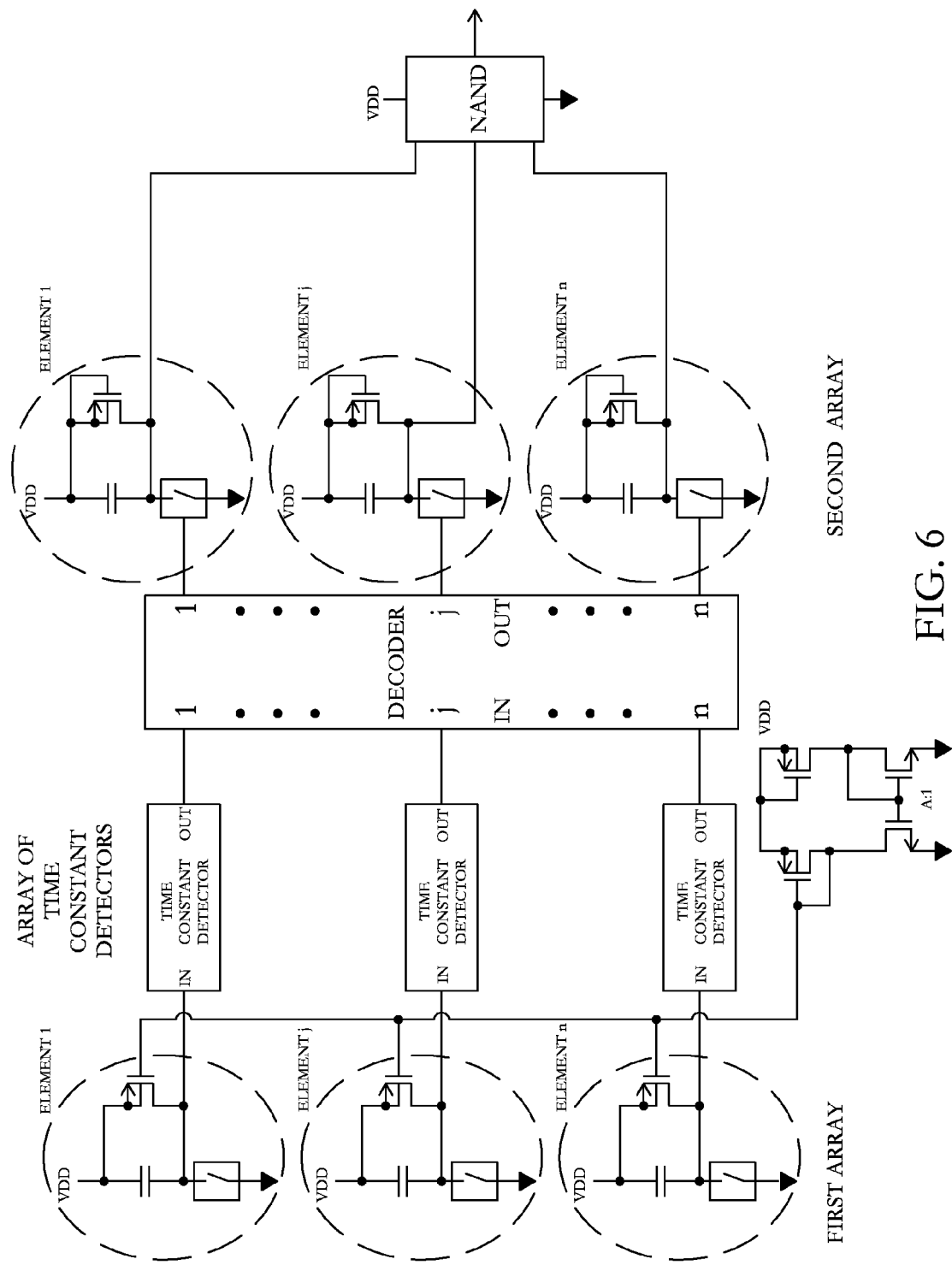
FIG. 6 shows the schematic of a one-bit memory persistence circuit similar to the one disclosed in FIG. 4, except that the capacitors from the two arrays discharge through PMOS transistors instead of NMOS transistors.

FIG. 6 shows the schematic of a one-bit memory persistence circuit, according to some embodiments of the present invention. The embodiment is similar to the embodiment shown in FIG. 4, except that the discharging transistors and the corresponding switches are of the complementary MOS type: PMOS instead of NMOS.

Figure 7:
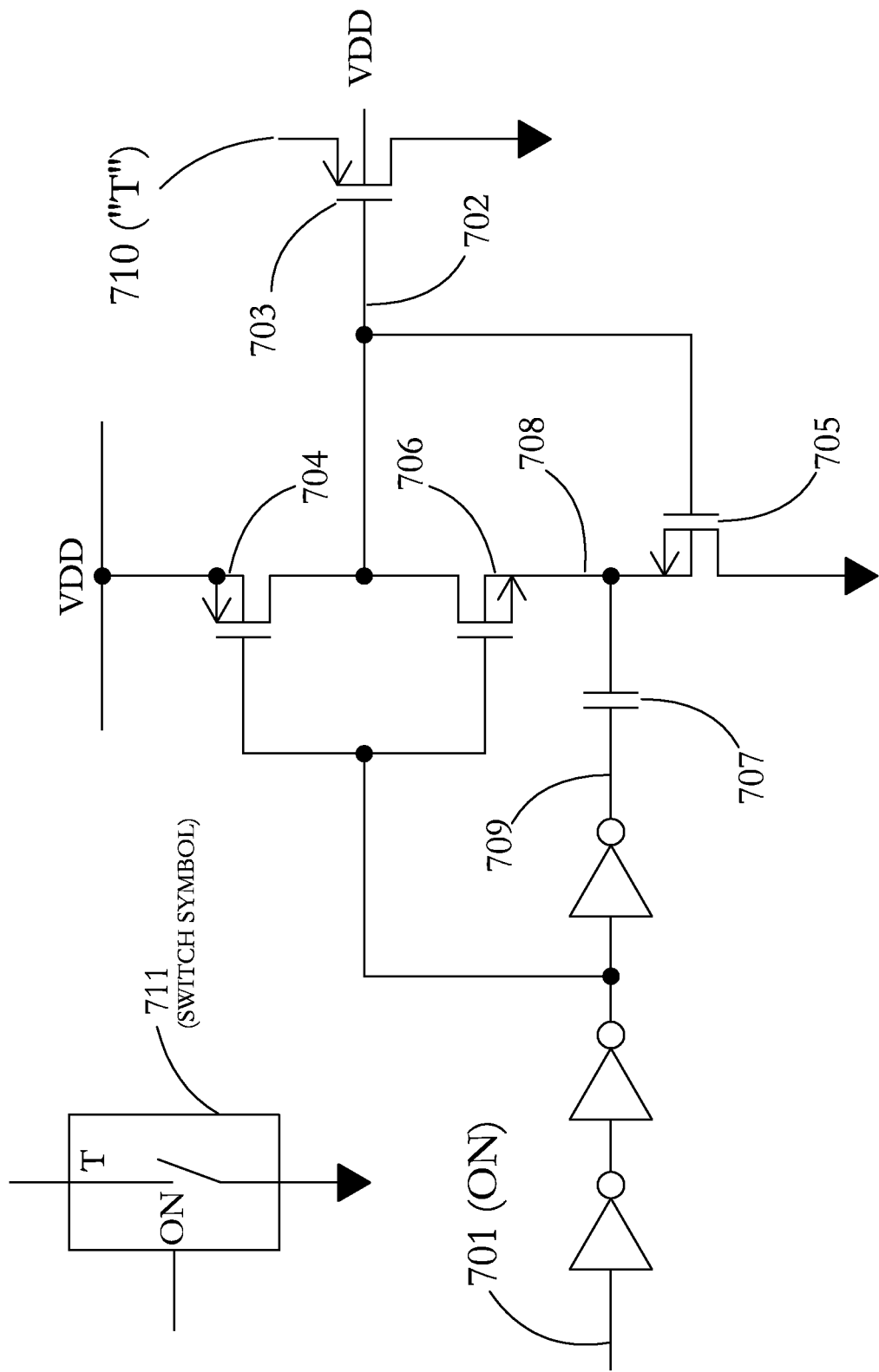
FIG. 7 shows the schematic of a switch connected to ground which maintains a low leakage even when the supply is removed.

Referring to FIG. 6, the switches from the second array must maintain their "off" state even when the power supply is removed. A simple NMOS transistor having the source and the bulk connected to ground cannot therefore be used, since the transistor will conduct current when VDD approaches zero and hence one plate of the discharging capacitor from the second array has a negative voltage. FIG. 7 shows the schematic of a switch using a negative voltage generator, and which ensures a very low leakage current after the power supply is removed, according to some embodiments of the present invention. The embodiment in FIG. 7 is implemented in a "triple-well" monolithic process, or more generally, in a process in which the bulk of NMOS transistors can be connected to an arbitrary voltage. The switching device is the PMOS transistor 703. The gate control voltage 702 is either VDD (in the "off" state), or approximately –VDD (in the "on" state). In the "off" state, 704 and 705 are turned on, hence the voltage across the capacitor 707 is substantially equal to VDD, wherein the voltage of the node 708 is substantially equal to zero. In the "on" state, 704 and 705 are turned off, 706 is turned on, the impedance of the node 708 becomes very high, and the voltage of 708 is equal to the voltage of 709 (~zero) minus the voltage across 707 (~VDD).

Figure 8:
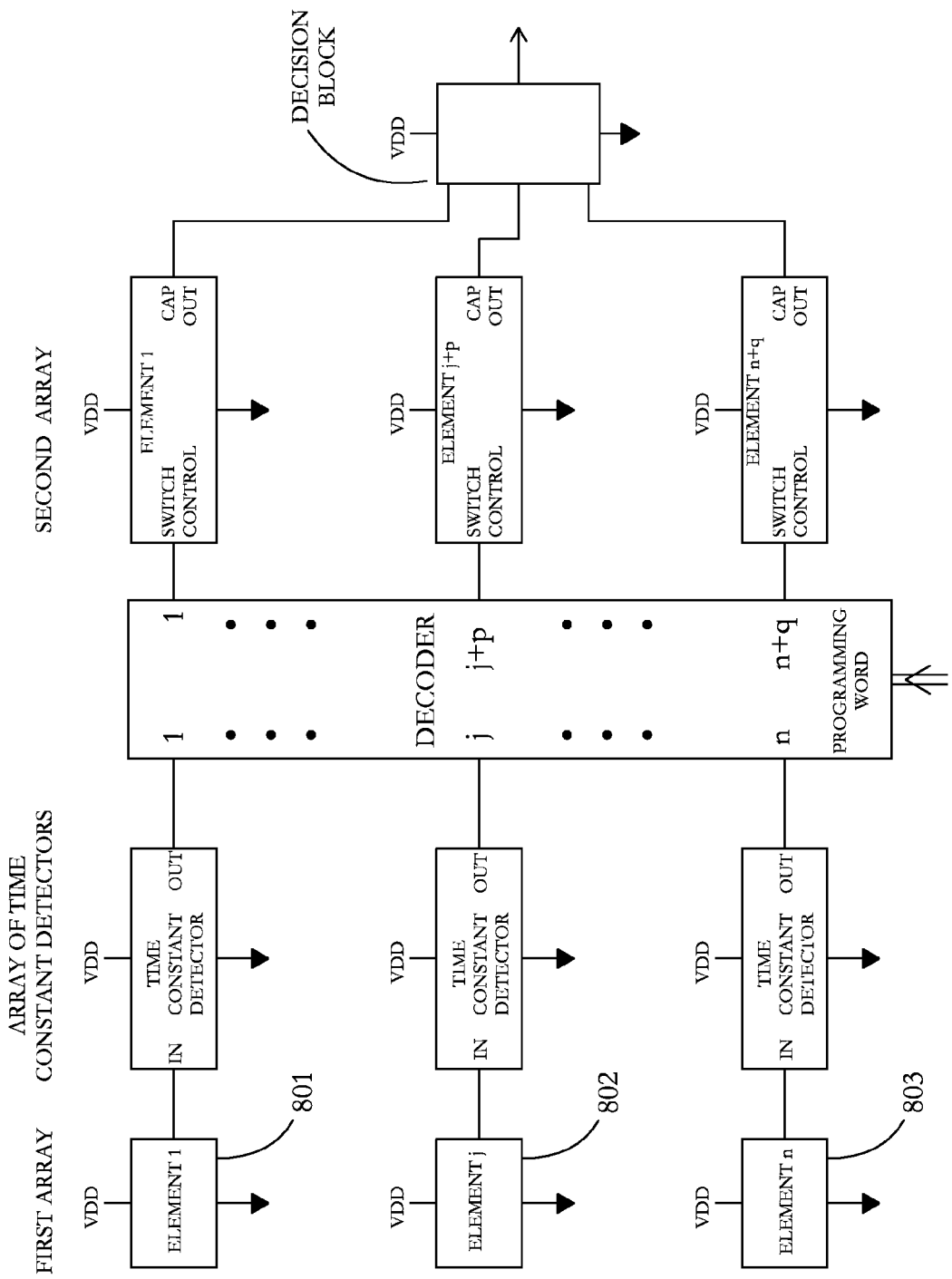
FIG. 8 shows the schematic of a programmable one-bit memory persistence circuit, comprising a first and a second arrays of elements, each element of the two arrays comprising a capacitor in parallel with a current-leaking device, wherein the discharge times of the elements in the second array compared to those from the first array are proportional. During the time when the power supply is applied a calibration circuit determines which element from the first array has the discharge time within a certain range, and an element from the second array is then selected by the decoder based upon the programming input, and then charged. After the power supply is removed, the said corresponding element will discharge, and a bit will be held to one during the discharge time, and to zero afterwards.

FIG. 8 shows the schematic of a one-bit memory persistence circuit, according to some embodiments of the present invention. The embodiment can be seen as a generalization of any of FIG. 3, 4, or 6, wherein the decoder is now programmable. The elements from the first array 801, 802, 803, and the elements from the second array 804, 805, 806, are drawn as symbols. With a fixed logic decoder (FIG. 3, 4, or 6), the selected element j from the second array is always the same as the highest-rank input being set to a logic one. Therefore, the duration of the persistence will always be approximately the same. In some applications it is desirable to be able to program the duration of the persistence to a different value. The programmable decoder will select, instead of the element j, another element (j+p in FIG. 7) which will depend upon the programmed word. The decoder 810 must have a higher number of outputs (n+q) than inputs (n). As an example, suppose that in the geometric progression G=1.1, and also suppose that we want to be able to program, besides the nominal duration, durations which are approximately 20% longer and, respectively, shorter. The decoder will select either j (for nominal duration), j+2 (for 20% longer duration), or j–2 (for 20% shorter duration). As a consequence, the second array of elements must have now n+4 elements.

Figure 9:
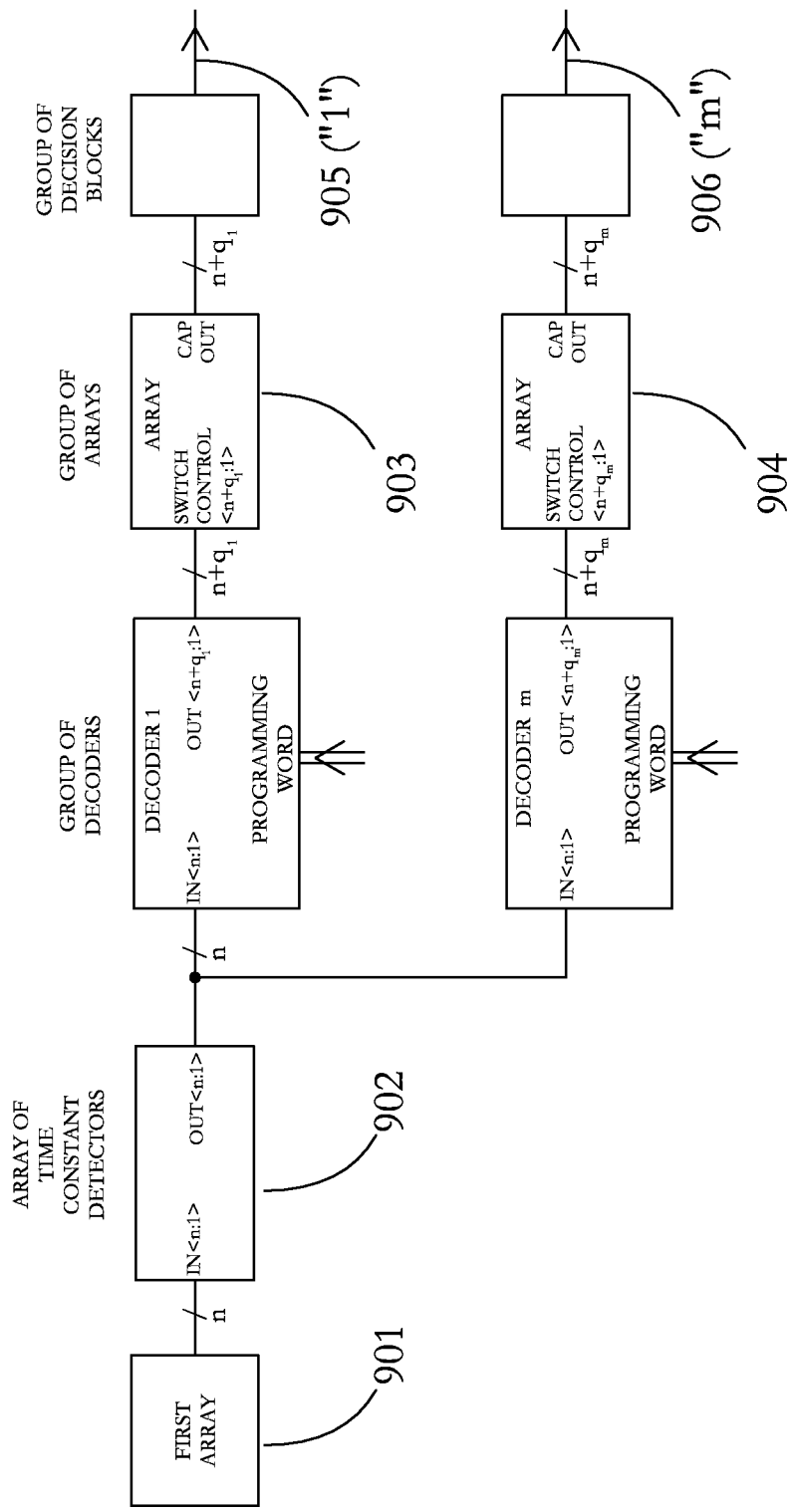
FIG. 9 shows the schematic of a multi-bit memory persistence circuit which is a generalization of the one-bit memory circuit disclosed in FIG. 7.

FIG. 9 shows the schematic of a multi-bit memory persistence circuit, having m memory bits, according to some embodiments of the present invention. The embodiment can be seen as a generalization of FIG. 8, wherein instead of a single decoder, a single second array, and a single OR decision block, there are now a group of m decoders, a group of m arrays, and a group of m OR decision blocks. The first array 901, the time constant detectors 902, and the arrays 903 and 904, from the group of arrays, are drawn as symbols. The first array of time constant detectors is connected to the input of each decoder. The output of each decoder, each array from the group of array, and each decision block are connected as disclosed in any of the embodiments for a one-bit memory. The first output memory bit is 905, and the m-th memory bit is 906.

It will be clear to one skilled in the art that the above embodiments may be altered in many ways without departing from the scope of the invention. Accordingly, the scope of the invention should be determined by the following claims and their legal equivalents.

What is claimed is:

1. An electronic circuit powered from a power supply, said electronic circuit setting and holding a digital output of at least one bit to a logic one after said power supply being removed and subsequently being re-applied, comprising:
   a group of digital outputs, comprising at least one such output;
   a first array of elements, each element comprising a two-plates capacitor in parallel with a p-n diode, and a switch having a first terminal, a second terminal, and a control terminal; wherein one plate of the capacitor and a first terminal of the diode are connected to ground, the other plate of the capacitor and a second terminal of the diode are connected together and further connected to the first terminal of the switch, the second terminal of the switch is connected to the power supply, and the ratios of the capacitance of the capacitor and the leakage current of the diode of each element of the first array form a monotonically increasing sequence;
   an array of time constant detectors having the same number of detectors as the number of elements from the first array, each detector corresponding to an unique element from the first array of elements, each detector having an input and an output, the detector output comprising a bit representative of a discharging duration of the detector input; wherein the input of each detector is coupled to the second terminal of the diode from the corresponding element from the first array of elements;
   a group of arrays of programmable digital decoders, comprising as many arrays as the group of digital outputs comprises digital outputs, each decoder having inputs and outputs, and each decoder having its inputs coupled to the outputs of the said array of time constant detectors;
   a group of arrays of elements, comprising as many arrays as the group of digital outputs comprises digital outputs, each array from the group having at least the same number of elements as the first array, each element from each array from the group of arrays comprising a two-plates capacitor in parallel with a p-n diode, and a switch having a first terminal, a second terminal, and a control terminal; wherein one plate of the capacitor and a first terminal of the diode are connected to ground, the other plate of the capacitor and a second terminal of the diode are connected together and further connected to the first terminal of the switch, the second terminal of the switch is connected to a storing capacitor, the control terminal of the switch is connected to an output of the decoder, and wherein each array from the group, the ratios of the capacitance of the capacitor and the leakage current of the diode of each element are scaled up and proportional to the said ratios from the first array of elements, each array from the group having its own proportionality factor; and
   a group of digital decision blocks, each digital decision block having inputs and an output, comprising as many decision blocks as the group of digital outputs comprises digital outputs, each decision block having the inputs connected to the cathodes of the diodes from the group of arrays of elements, and the output connected to one output form the said group of digital outputs of the electronic circuit.

2. The electronic circuit from claim 1, wherein the monotonically increasing sequence is substantially close to a geometric progression.

3. The electronic circuit from claim 1, realized in the form of a monolithic circuit.

4. The circuit from claim 3, wherein each switch from the group of arrays of elements comprises:
   an NMOS transistor, having the drain connected to the first terminal of the switch, and the source connected to the second terminal of the switch; and
   a voltage boosting circuit comprising a boosted voltage output, having the boosted voltage output connected to the gate of the said NMOS transistor from the switch.

5. An electronic circuit powered from a power supply, said electronic circuit setting and holding a digital output of at least one bit to a logic one after said power supply being removed and subsequently being re-applied, comprising:
   a group of digital outputs, comprising at least one such output;
   a first array of elements, each element comprising a two-plates capacitor in parallel with an NMOS transistor having a source, a drain, and a gate, and further in parallel with a switch having a first terminal a second terminal and a control terminal; wherein one plate of the capacitor and the source of the transistor are connected to ground, the other plate of the capacitor and the drain of the transistor are connected together and further connected to the first terminal of the switch, the second terminal of the switch is connected to the power supply, and the ratios of the capacitance of the capacitor and the drain current of the transistor of each element of the first array form a monotonically increasing sequence;
   an array of time constant detectors having the same number of detectors as the number of elements from the first array, each detector corresponding to an unique element from the first array of elements, each detector having an input and an output, the detector output comprising a bit representative of a discharge duration of the detector input; wherein the input of each detector is coupled to the drain of the NMOS transistor from the corresponding element from the first array of elements;
   a group of arrays of programmable digital decoders, comprising as many arrays as the group of digital outputs comprises digital outputs, each decoder having inputs and outputs, and each decoder having its inputs coupled to the outputs of the said array of time constant detectors;
   a group of arrays of elements, comprising as many arrays as the group of digital outputs comprises digital outputs, each array from the group having at least the same number of elements as the first array, each element from each array from the group of arrays comprising a two-plates capacitor in parallel with an NMOS transistor having a source, a drain, and a gate, and further in parallel with a switch having a first terminal, a second terminal, and a control terminal; wherein one plate of the capacitor and the source of the transistor are connected to ground, the other plate of the capacitor and the drain of the transistor are connected together and further connected to the first terminal of the switch, the second terminal of the switch is connected to the power supply, the control terminal of the switch is connected to the output of the said decoder, and wherein each array of the group the ratios of the capacitance of the capacitor and the drain current of the transistor of each element are scaled up and proportional to the said ratios from the first array of elements, each array from the group of arrays having its own proportionality factor; and
   a group of digital decision blocks, each digital decision block having inputs and an output, comprising as many decision blocks as the group of digital outputs comprises digital outputs, each decision block having the inputs connected to the drains of the transistors from the group of arrays of elements, and the output connected to one output form the said group of digital outputs of the electronic circuit.

6. The electronic circuit from claim 5, wherein the monotonically increasing sequence is substantially close to a geometric progression.

7. The electronic circuit from claim 5, wherein each switch from the group of arrays of elements comprises:
   an NMOS transistor, having the drain connected to the first terminal of the switch, and the source connected to the second terminal of the switch; and
   a voltage boosting circuit comprising a boosted voltage output, having the boosted voltage output connected to the gate of the said NMOS transistor from the switch.

8. The electronic circuit from claim 5, further comprising a biasing circuit for the gates of the NMOS transistors from the first array, wherein the biasing circuit comprises at least a current mirror, wherein the current mirror mirrors the current of a MOS transistor biased in the sub-threshold region.

9. The electronic circuit from claim 5, realized in the form of a monolithic circuit.

10. An electronic circuit powered from a power supply, said electronic circuit setting and holding a digital output of at least one bit to a logic one after said power supply being removed and subsequently being re-applied, comprising:
    a group of digital outputs, comprising at least one such output;
    a first array of elements, each element comprising a two-plates capacitor in parallel with a PMOS transistor having a source, a drain, and a gate, and further in parallel with a switch having a first terminal, a second terminal, and a control terminal; wherein one plate of the capacitor and the source of the transistor are connected to the power supply, the other plate of the capacitor and the drain of the transistor are connected together and further connected to the first terminal of the switch, the second terminal of the switch is connected to the ground, and the ratios of the capacitance of the capacitor and the drain current of the transistor of each element of the first array form a monotonically increasing sequence;
    an array of time constant detectors having the same number of detectors as the number of elements from the first array, each detector corresponding to an unique element from the first array of elements, each detector having an input and an output, the detector output comprising a bit representative of a discharge duration of the detector input; wherein the input of each detector is coupled to the drain of the PMOS transistor from the corresponding element from the first array of elements;
    a group of arrays of programmable digital decoders, comprising as many arrays as the group of digital outputs comprises digital outputs, each decoder having inputs and outputs, and each decoder having its inputs coupled to the outputs of the said array of time constant detectors;
    a group of arrays of elements, comprising as many arrays as the group of digital outputs comprises digital outputs, each array from the group having the same number of elements as the first array, each element from each array from the group of arrays comprising a two-plates capacitor in parallel with a PMOS transistor having a source, a drain, and a gate, and further in parallel with a switch having a first terminal, a second terminal, and a control terminal; wherein one plate of the capacitor and the source of the transistor are connected to the power supply, the other plate of the capacitor and the drain of the transistor are connected together and further connected to the first terminal of the switch, the second terminal of the switch is connected to ground, the control terminal of the switch is connected to the output of the said decoder, and wherein each array of the group the ratios of the capacitance of the capacitor and the drain current of the transistor of each element are scaled up and proportional to the said ratios from the first array of elements, each array from the group of arrays having its own proportionality factor; and
    a group of digital decision blocks, each digital decision block having inputs and an output, comprising as many decision blocks as the group of digital outputs comprises digital outputs, each decision block having the inputs connected to the drains of the transistors from the group of arrays of elements, and the output connected to one output form the said group of digital outputs of the electronic circuit.

11. The electronic circuit from claim 10, wherein the monotonically increasing sequence is substantially close to a geometric progression.

12. The electronic circuit from claim 10, realized in a monolithic process having triple-well NMOS transistors, wherein each switch from the group of arrays of elements comprises:
    a PMOS transistor, having the drain connected to the first terminal of the switch, and the source connected to the second terminal of the switch; and
    a negative voltage generator circuit comprising a negative voltage output, having the negative voltage output connected to the gate of the said PMOS transistor from the switch.

13. The electronic circuit from claim 10, further comprising a biasing circuit for the gates of the PMOS transistors from the first array, wherein the biasing circuit comprises at least a current mirror, wherein the current mirror mirrors the current of a MOS transistor biased in the sub-threshold region.

14. The electronic circuit from claim 10, realized in the form of a monolithic circuit.

15. A method for generating a memory of at least one bit, persistent for a certain duration after the power supply in an electronic circuit being removed and subsequently being re-applied, the method comprising:
    selecting a first element, while the power supply is applied to the electronic circuit, from a first array of elements, wherein each element from the first array of elements comprises a capacitor discharged by a current-leaking device, such that a discharging time of the selected first element is the closest to a pre-determined value, as said discharging time is compared to discharging times of other elements from the first array;
    selecting a second element from a second array of elements, wherein each element from the first array of elements corresponds to a unique element from the second array of elements, wherein each element from the second array comprises a capacitor discharged by a current-leaking device, such that the discharging time of any element from the second array of elements is scaled up, and proportional with, the discharging time of the corresponding element from the first array of elements;
    charging and leaving charged the capacitance of the second selected element from the second array, while the power supply is applied to the electronic circuit;
    discharging, as soon as the power supply is removed, the capacitor from the selected second element;

setting an output signal to logic one while the voltage across the capacitor from the selected second element is higher than the threshold voltage of the input of a digital block, and to zero while the said voltage is lower than the said threshold.

* * * * *